United States Patent
Goodwin

(10) Patent No.: US 11,230,926 B2
(45) Date of Patent: Jan. 25, 2022

(54) HIGH CYCLE FATIGUE DESIGN FOR GAS TURBINE ENGINES

(71) Applicant: Rolls-Royce Corporation, Indianapolis, IN (US)

(72) Inventor: Darrell J. Goodwin, Carmel, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 140 days.

(21) Appl. No.: 16/707,081

(22) Filed: Dec. 9, 2019

(65) Prior Publication Data

US 2021/0172322 A1   Jun. 10, 2021

(51) Int. Cl.
| | |
|---|---|
| *F01D 5/10* | (2006.01) |
| *B33Y 80/00* | (2015.01) |
| *B33Y 10/00* | (2015.01) |
| *G06F 30/17* | (2020.01) |

(52) U.S. Cl.
CPC ............... *F01D 5/10* (2013.01); *G06F 30/17* (2020.01); *B33Y 10/00* (2014.12); *B33Y 80/00* (2014.12); *F05D 2230/30* (2013.01); *F05D 2260/83* (2013.01); *F05D 2260/961* (2013.01)

(58) Field of Classification Search
CPC .......... F01D 5/10; G06F 30/17; B33Y 80/00; B33Y 10/00; F05D 2260/83; F05D 2260/961; F05D 2230/30
See application file for complete search history.

(56) References Cited

U.S. PATENT DOCUMENTS

| | | | |
|---|---|---|---|
| 6,718,833 B2 | 4/2004 | Xie et al. | |
| 8,006,544 B2 | 8/2011 | Holmes et al. | |
| 8,479,586 B2 | 7/2013 | Miyakozawa et al. | |
| 8,834,098 B2 * | 9/2014 | Glaspey | F01D 5/284 |
| | | | 415/119 |
| 9,829,420 B2 | 11/2017 | Meriaux et al. | |
| 10,233,758 B2 * | 3/2019 | Duong | F01D 5/145 |
| 2013/0142659 A1 * | 6/2013 | Glaspey | F01D 9/02 |
| | | | 416/241 A |
| 2016/0208624 A1 | 7/2016 | Smith | |
| 2016/0222818 A1 * | 8/2016 | Ivanovich | H01L 51/428 |
| 2016/0230561 A1 * | 8/2016 | Duong | F01D 5/26 |
| 2017/0130585 A1 | 5/2017 | Kray et al. | |

FOREIGN PATENT DOCUMENTS

| | | |
|---|---|---|
| CN | 103196644 | 7/2013 |
| CN | 103728111 | 4/2014 |
| CN | 108254144 | 7/2018 |
| EP | 1813773 | 8/2007 |

OTHER PUBLICATIONS

Daniel Hoyniak; Aerodynamic detuned rotor operating in a supersonic flow; Nasa Tech Memo #87093; Oct. 13, 1985.*

* cited by examiner

*Primary Examiner* — Lawrence Averick
(74) *Attorney, Agent, or Firm* — Barnes & Thornburg LLP

(57) ABSTRACT

Devices, systems, and methods for making gas turbine engine component with high cycle fatigue performance include selecting target airfoils while detuning other airfoils. The selective detuning can reduce resource intensity for realistic testing during build. Conforming detuning masses can reduce the need for outside resources.

19 Claims, 8 Drawing Sheets

HIGH CYCLE FATIGUE DESIGN FOR GAS TURBINE ENGINES

BACKGROUND

The present disclosure relates generally to devices, systems, and methods of gas turbines engines, and more specifically to devices, systems, and methods of subassemblies of gas turbine engines.

Gas turbine engines can be used to power aircraft, watercraft, electrical generators, and the like. Gas turbine engines typically include a compressor, a combustor, and a turbine. The compressor compresses air drawn into the engine and delivers high pressure air to the combustor. In the combustor, fuel is mixed with the high pressure air and is ignited. Exhaust products of the combustion reaction in the combustor are directed into the turbine where work is extracted to drive the compressor and, sometimes, an output shaft, fan, or propeller. Portions of the work extracted from the turbine can be used to drive various subsystems such as generators.

In building gas turbine engine components, fatigue can be a challenging aspect to assess and/or address in design. Real world assessment can be time, energy, and/or resource intensive.

SUMMARY

The present disclosure may comprise one or more of the following features and combinations thereof.

According to an aspect of the present disclosure, a method of making an airfoil array of a gas turbine engine by high cycle testing may include selecting one or more target airfoils of the airfoil array having an existing configuration; detuning one or more detuned airfoils of the airfoil array other than the one or more target airfoils, wherein detuning includes securing detuning mass to the one or more detuned airfoils; assessing excitation response of the one or more target airfoils to set a maximum excitation response of the one or more target airfoils; determining design compliance by comparing the maximum excitation response to a predicted operational response of the airfoil array under operation of the gas turbine engine; and responsive to determining design compliance, setting airfoil design configuration for the airfoil array as the existing configuration of the one or more target airfoils.

In some embodiments, the method may further comprise, after assessing excitation response of the one or more target airfoils to determine a maximum excitation response, removing detuning mass from one or more select ones of the detuned airfoils and re-assessing excitation response of the one or more target airfoils to set a revised maximum excitation. In some embodiments, the method may further comprise determining whether the revised maximum excitation represents decreased excitation amplitude of the one or more target airfoils from the maximum excitation response. In some embodiments, the method may further comprise, responsive to determination that the revised maximum excitation represents decreased excitation amplitude, setting the maximum excitation response as a design maximum of the one or more target airfoils.

In some embodiments, the maximum excitation response may include maximum excitation amplitude. Assessing excitation response may include subjecting the airfoil array to output from a signal generator. The signal generator may include a sound wave generator.

In some embodiments, securing detuning mass may include securing a detuning body to each of the one or more detuned airfoils. Each detuning body may include an airfoil engagement surface conforming with an exterior airfoil-shaped surface of the corresponding detuned airfoil. In some embodiments, the method may further comprise building each of the detuning bodies.

In some embodiments, building each of the detuning bodies may include forming at least one tooling member by additive manufacturing for forming a mold of one or more of the detuning bodies. The at least one tooling member may include a mock body of one or more of the detuning bodies. Each detuning body may comprise a split frame comprising high density material. In some embodiments, each portion of the split frame of each detuning body may be formed for engagement with a portion of an exterior airfoil-shaped surface of the corresponding detuned airfoil.

In some embodiments, detuning may include detuning all airfoils except for one target airfoil and eight airfoils immediately adjacent in the clockwise direction and eight airfoils immediately adjacent in the counter-clockwise direction relative to the target airfoil. In some embodiments, detuning may include detuning all airfoils except for one target airfoil and five airfoils immediately adjacent in the clockwise direction and five airfoils immediately adjacent in the counter-clockwise direction relative to the target airfoil. In some embodiments, detuning may include detuning all airfoils except for one target airfoil and three airfoils immediately adjacent in the clockwise direction and three airfoils immediately adjacent in the counter-clockwise direction relative to the target airfoil.

In some embodiments, detuning may include detuning all airfoils except for one target airfoil and second, fourth, and sixth airfoils adjacent in the clockwise direction and second, fourth, and sixth airfoils adjacent in the counter-clockwise direction relative to the target airfoil. In some embodiments, detuning includes detuning all airfoils except for one target airfoil.

In some embodiments, the airfoil array may be a fixed-boundary array comprising inner and outer end walls coupled with each airfoil of the airfoil array. In some embodiments, the existing configuration may include an existing surface geometry of an exterior airfoil-shaped surface of the one or more target airfoils.

These and other features of the present disclosure will become more apparent from the following description of the illustrative embodiments.

DETAILED DESCRIPTION OF THE DRAWINGS

Figure 1:
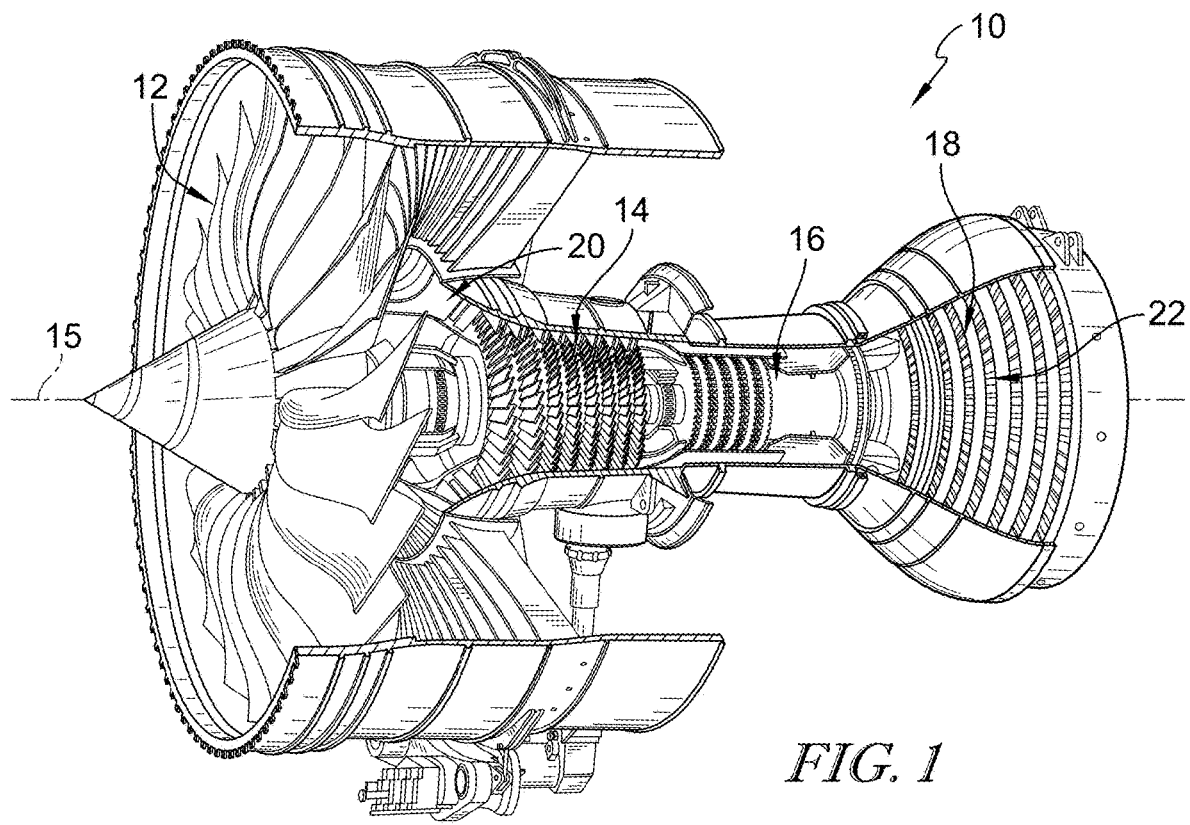
FIG. 1 is an perspective view of gas turbine engine having a portion cutaway to show that the engine includes a core flow path including a fan for drawing air, a compressor for compressing air from the fan, a combustor for combusting fuel mixed with compressed air from the compressor, and a turbine including a rotor and blades for expanding exhaust products to rotate the rotor and a fan shaft for driving the fan, and showing that the engine includes an engine core stator including an airfoil assembly disposed between the fan and the compressor for guiding air from the fan into the compressor.

For the purposes of promoting an understanding of the principles of the disclosure, reference will now be made to a number of illustrative embodiments illustrated in the drawings and specific language will be used to describe the same.

Referring now to FIG. 1, an illustrative gas turbine engine 10 is shown having partial cutaway for descriptive purposes. The gas turbine engine 10 includes fan 12 arranged at a forward end, a compressor 14, a combustor 16, and a turbine 18. The compressor 14 is arranged for compressing air received from the fan 12. An engine core stator 20 is arranged near the inlet to the compressor 14 to guide air from the fan into the compressor 14. The combustor 16 combusts a mixture of compressed air from the compressor 14 with fuel and produces hot exhaust flow. The turbine 18 is arranged to expand hot exhaust flow from the combustor 16 to provide engine thrust and mechanical force of rotation about an axis 15. Expanded exhaust flow is expelled from the turbine 18 at an aft end for propulsion.

The turbine 18 includes an low pressure (LP) section and high pressure (HP) section, each including a rotor and blades 22 extending radially from the rotor for transferring exhaust flow expansion into rotational force of the rotor. In the illustrative embodiment, the rotor of the LP section is coupled with an LP shaft which is coupled with a fan shaft for transmitting rotational force to the fan 12. The rotor of the HP section is coupled with an HP shaft which is coupled with the compressor 16 for transmitting rotational force for compression of air. In some embodiments, an intermediate pressure shaft may couple an intermediate section of the turbine 18 with an intermediate section of the compressor 14.

Gas turbine engines may be adapted for various uses, such as to propel aircraft, watercraft, and/or for electrical power generation. Gas turbine operation can subject components to high temperature and/or pressure conditions, and component design can account for the expected conditions with margins of safety. For example, stationary components which experience high temperatures during gas turbine operation can be constructed using materials which can tolerate high temperatures well, in consideration their other physical loads. However, component response to dynamic conditions may be less predictable, and extensive design compliance evaluation may be required for each individual design.

For example, gas turbine engine components which can experience large dynamic and/or vibratory loads may require significant high energy evaluation to insure adequate design, such as to avoid cracking and/or breaking during operation. Yet, reliable testing itself may be highly resource intensive, require long lead times, and/or be costly. By example, high cycle fatigue testing of airfoil arrays of gas turbine engines can be challenging to implement.

Adequate testing of airfoil arrays in natural resonant modes higher than their fundamental mode can be particularly challenging. Approximations of operational conditions can fail to produce reliable test data, while full field testing can face even greater physical and/or logistical challenges. High cycle fatigue testing of full (complete) airfoil arrays can be particularly challenging and/or unworkable in practical turbine development facilities.

For example, the amount of energy required to excite full airfoil arrays to their higher-than-fundamental resonant modes may exceed available test equipment and/or resources. And the required amount of energy for excitation may be further increased according to the particular arrangements of the airfoil array—for example, full field, fixed-fixed boundary airfoil arrays may require particularly high energy for excitation to their higher-than-fundamental resonant modes.

Figure 2:
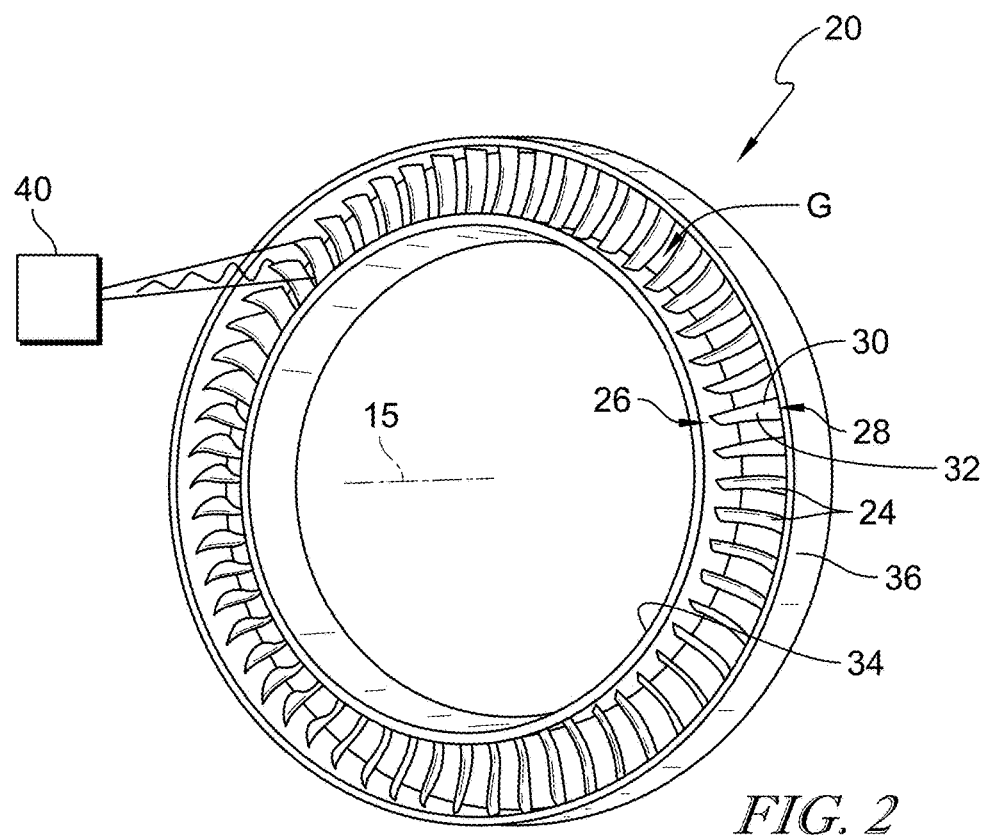
FIG. 2 is a perspective view the engine core stator of the gas turbine engine in FIG. 1 in isolation showing that it includes a number of airfoils extending radial from an inner ring.

Referring now to FIG. 2, the engine core stator 20 is shown in isolation for descriptive ease. The engine core stator 20 is embodied as a full field airfoil array comprising airfoils 24. Each airfoil 24 includes an inner end 26 and outer end 28. The airfoils 24 each include an airfoil wall 30 extending between the inner 26 and outer ends 28 to define an exterior airfoil surface 32.

An exterior airfoil surface 32 of each airfoil 24 is formed to have aerodynamic shape to assist in guiding flow of air from the fan 12 into the compressor 14. In the illustrative embodiment, the exterior airfoil surface 32 of each airfoil 24 includes the same aerodynamic shape, although in some embodiments, the aerodynamic shape of airfoils 24 of the array may differ.

Each airfoil 24 is secured with an inner ring 34. The inner ring 34 is illustratively embodied as an inner end wall formed annularly about the axis 15 and defining a radially inner flow boundary for guiding air from the fan 12 into the compressor 14. The inner ring 34 is connected with the inner end 26 of each airfoil 24.

In the illustrative embodiment, the engine core stator 20 includes an outer ring 36. The outer ring 36 is connected with the outer end 28 of each airfoil 24. The outer ring 36 is illustratively embodied as an outer end wall formed annularly about the axis 15 and defining a radially outer flow boundary for guiding air from the fan 12 into the compressor 14. In some embodiments, the outer ring 36 may be omitted, for example, by arrangement of one or more airfoils 24 cantilevered to extend to a free end at their outer end 28. In some embodiments, the inner ring 34 may be omitted, for example, by arrangement of one or more airfoils 24 cantilevered to extend to a free end at their inner end 26.

Each airfoil 24 is spaced apart circumferentially from adjacent airfoils 24 by a gap G allowing passage of flow of air from the fan 12 through the engine core stator 20 into the compressor 14. In the illustrative embodiment, the gap G between adjacent airfoils 24 is equal for all airfoils 24 of the array, but in some embodiments, the gap between adjacent airfoils 24 may be different for airfoils 24 of different locations about the axis 15.

Still referring to FIG. 2, high cycle fatigue testing can be performed to insure the integrity of performance of the engine core stator 20. A signal generator 40 is illustratively embodied as an exciter for exciting response from the airfoils. The signal generator 40 includes a signal control processor and signal generation circuitry to provide focused sinusoidal signals to excite excitation response of the engine core stator 20, although any suitable signal type may be applied. The signal generator 40 is illustratively embodied as a sound generator having directional nozzle arranged to provide focused high energy sound waves to the engine core stator 20, although any suitable manner of focused high energy signal generation may be applied, for example, an air jet tuned to natural resonant frequencies.

By exciting higher-than-fundamental modes of excitation, operational dynamic and/or vibratory limitations of the airfoil array can be compared with predicted conditions under gas turbine engine operation to insure that the airfoil array can safely endure the full spectrum of conditions it may experience during gas turbine engine operation to determine design compliance. Accordingly, once design compliance can be determined, the configuration of airfoils and the design maximum of the airfoil array can be set for high cycle fatigue. Accordingly, once the design maximum is set, general and/or mass production of the airfoil array can be confidently undertaken with the confirmed design configuration. In some embodiments, setting the design maximum may include installing the airfoil array into a gas turbine engine.

However, as mentioned above, performing high cycle fatigue on the entire full field array to simultaneously excite fundamental and/or higher-than-fundamental modes of all airfoils 24 of the entire engine core stator 20 can be challenging. For example, the required energy from the signal generator 40 for full field excitation of the engine core stator 20 may be impractical. Accordingly, the present disclosure includes systems, devices, and methods for making airfoil arrays through high cycle fatigue testing by selectively detuning of airfoils. As discussed in additional detail below, by selectively detuning airfoils, targeted airfoils can be more easily excited, for example, by lower excitation energy requirements, to determine design compliance and/or set airfoil configuration.

Figure 3:
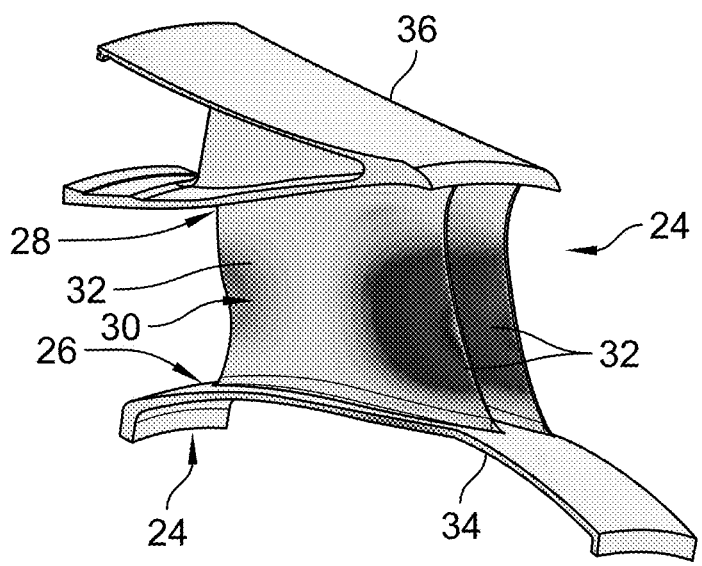
FIG. 3 is a perspective view of a few of the airfoils of the engine core stator of FIGS. 1 and 2, showing in shading that excitation response has been prompted from an excitation generator to simulate high cycle fatigue that can occur under gas turbine operation.

Referring to FIG. 3, an exemplary illustration of a portion of the engine core stator 20 including a pair of the airfoils 24, shown in isolation for descriptive ease. The airfoils 24 include shading to indicate areas of higher vibrational excitation response. For example, higher excitation response can be observed at the leading and trailing edges of each airfoil 24, and generally mid-way between the inner and outer ends 26, 28, as shown by more intense shading at those areas.

Figure 4:
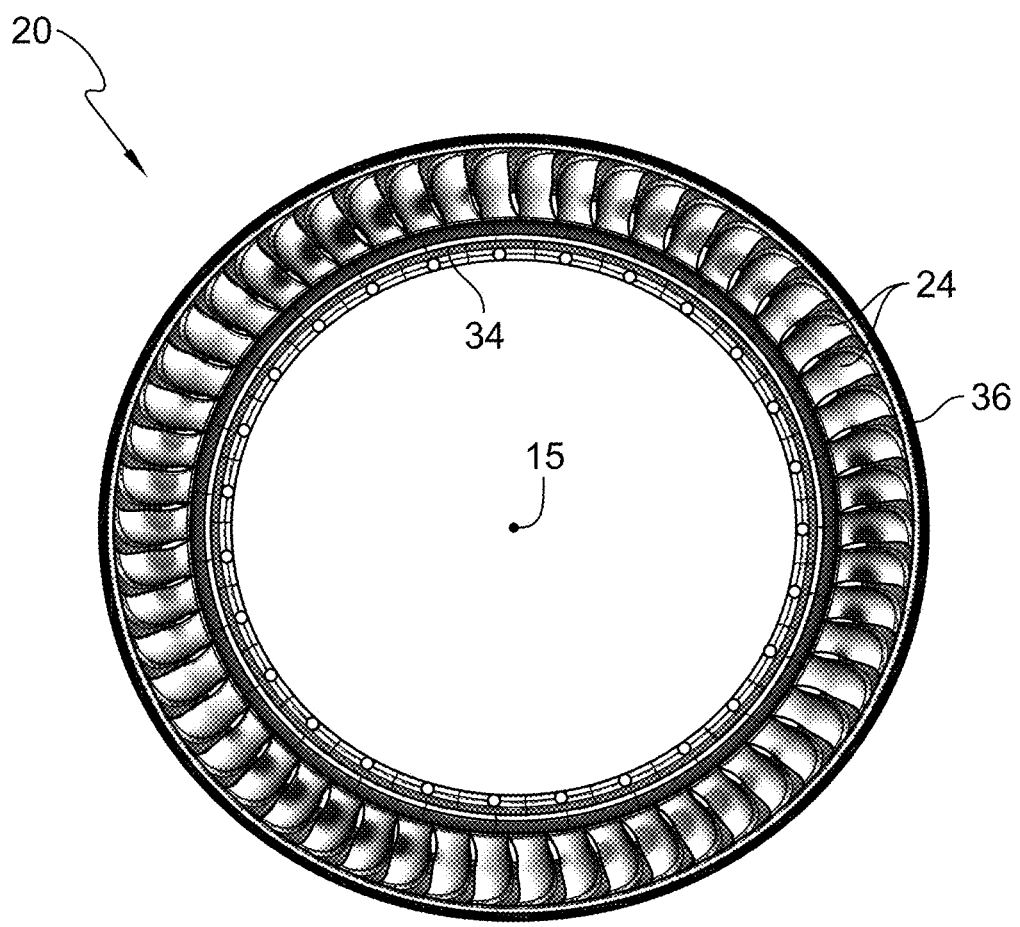
FIG. 4 is an axial view of the engine core stator of FIGS. 1-3, indicating an example of local and global vibration response that can be exhibited in the engine core stator.

Referring now to FIG. 4, the engine core stator 20 is shown indicating an effect of global participation of the airfoils 24 in one form of resonant vibration excitation response that is to be controlled by the design of the airfoils 24. The more intensely shaded areas along the airfoil array indicated higher collective vibrational response spanning locally across several adjacent airfoils 24. These higher collective vibrational responses can lead to premature failure of components if unaddressed in the design-build stage of the airfoil array.

Figure 5A:
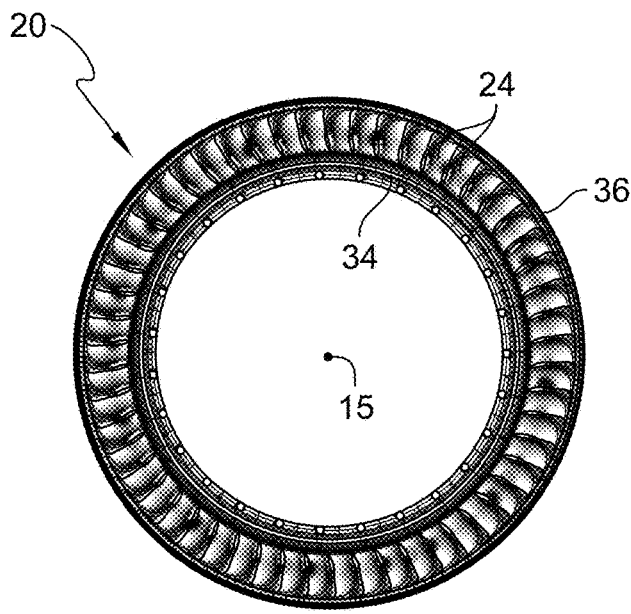
FIG. 5A is an axial view of the engine core stator indicating an example of a target resonance mode.

Referring now to FIGS. 5A-7, detuning is described in terms of target airfoils. In FIG. 5A, a target resonant mode of the engine core stator 20 is shown for demonstration purposes indicating desirable control of the effects of excitation by the make of the airfoils 24. The areas of higher excitation in FIG. 5A are less densely shaded that the areas of higher excitation in FIG. 4, indicating less dramatic excitation to the excitation input.

Figure 5B:
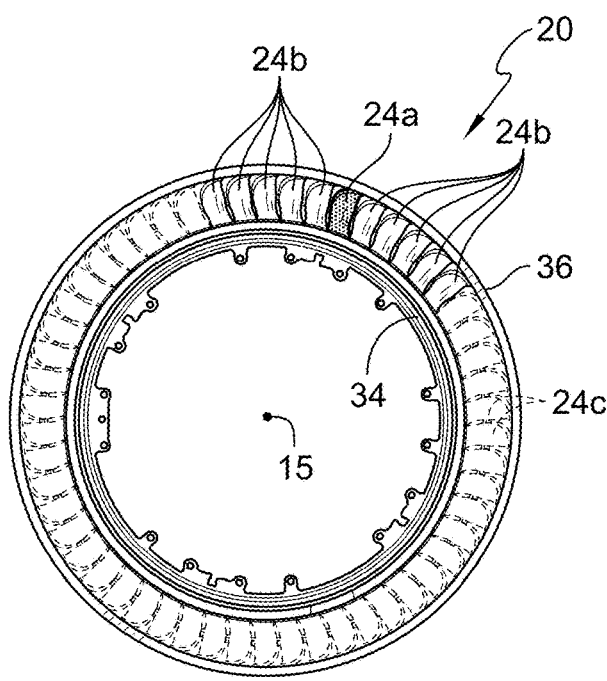
FIGS. 5B-7 are axial view of the engine core stator indicating various examples of target phase arrangements for assessment, with select target airfoils and other airfoils being detuned.
Figure 5C:
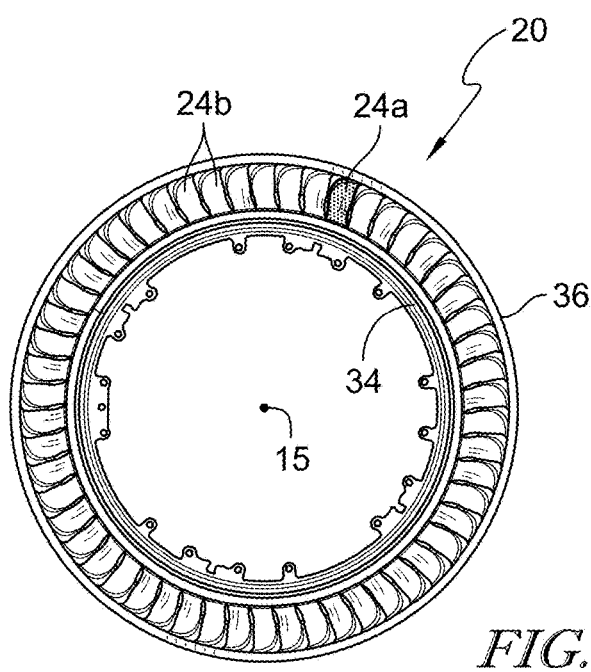

As shown in FIG. 5B, an optimized detuning state is shown for example, in which a target airfoil 24a and adjacent target airfoils 24b are without detuning (as indicated in solid line), and other detuned airfoils 24c (as indicated in broken line). As discussed in additional detail herein, detuning includes disrupting the natural response characteristics, for example, by the additional of significant mass to the detuned airfoil 24c to inhibit its individual excitation response and its contribution to global excitation response. As shown in FIG. 5C, targeted excitation of the target airfoil 24a may be performed with all other airfoils 24b having no detuning, for background information.

Figure 6A:
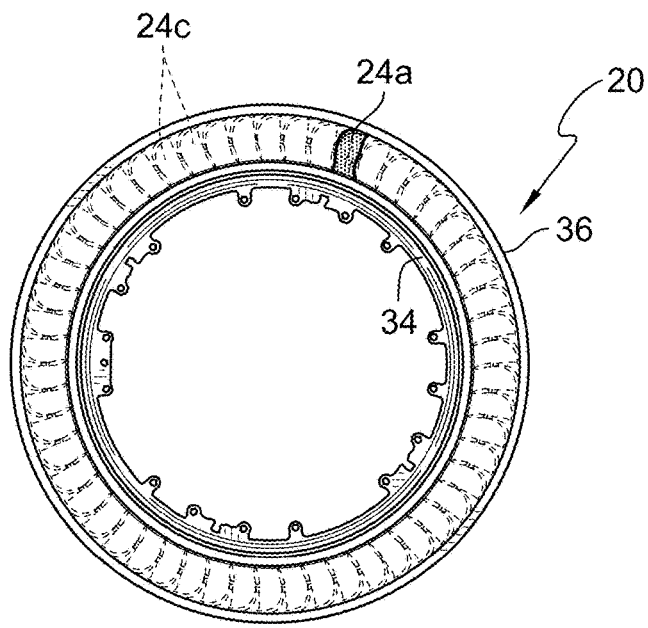

Referring now to FIG. 6A, in order to pursue such target resonant modes as illustrated in FIG. 5A, detuning and assessment of excitation response may be performed in an individual target phase. As shown in FIG. 6A, a target airfoil 24a can be selected. The target airfoil 24a can be isolated for excitation. In the individual target phase, the other airfoils 24c are all detuned. The target airfoil 24a can then be subjected to focused excitation by the signal generator 40 for assessment to set a maximum excitation response individual target phase.

Figure 6B:
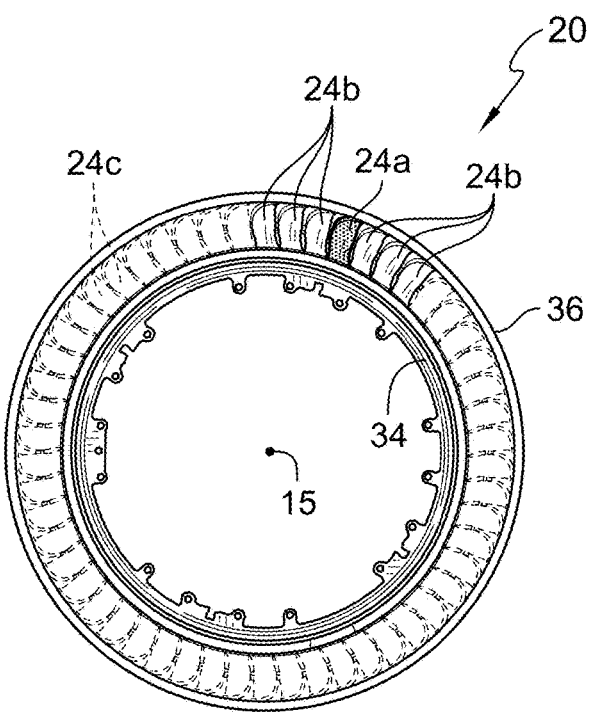

As shown in FIG. 6B, detuning and assessment of excitation response may be performed in an 1+6 target phase. In the 1+6 target phase, the target airfoil 24a and six adjacent airfoils 24b remain without detuning, while other airfoils 24c are detuned. In the illustrative embodiment of the 1+6 target phase, three airfoils 24b immediately adjacent the target airfoil 24a on either circumferential side thereof are selected with the target airfoil 24a as not detuned. The target airfoil 24a can then be subjected to focused excitation by the signal generator 40 for assessment to set a maximum excitation response in the 1+6 target phase.

Figure 6C:
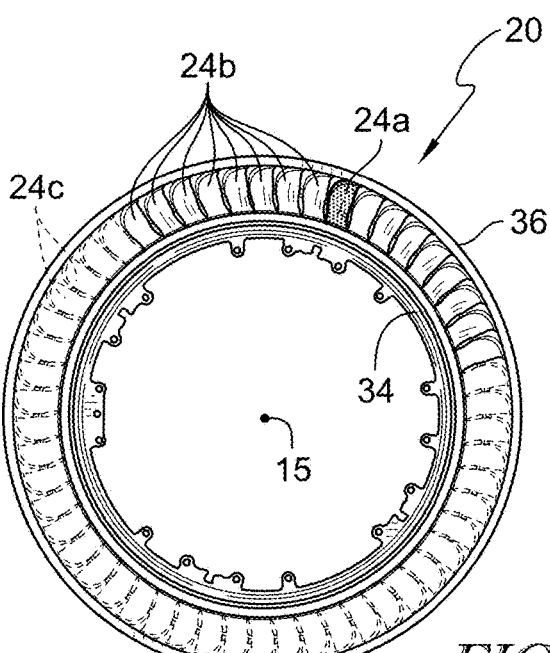

As shown in FIG. 6C, detuning and assessment of excitation response may be performed in an 1+16 target phase. In the 1+16 target phase, the target airfoil 24a and adjacent sixteen airfoils 24b remain without detuning, while other airfoils 24c are detuned. In the illustrative embodiment of the 1+16 target phase, eight airfoils 24b immediately adjacent the target airfoil 24a on either circumferential side thereof are selected with the target airfoil 24a as not detuned. The target airfoil 24a can then be subjected to focused excitation by the signal generator 40 for assessment to set a maximum excitation response in the 1+16 target phase.

Figure 7:
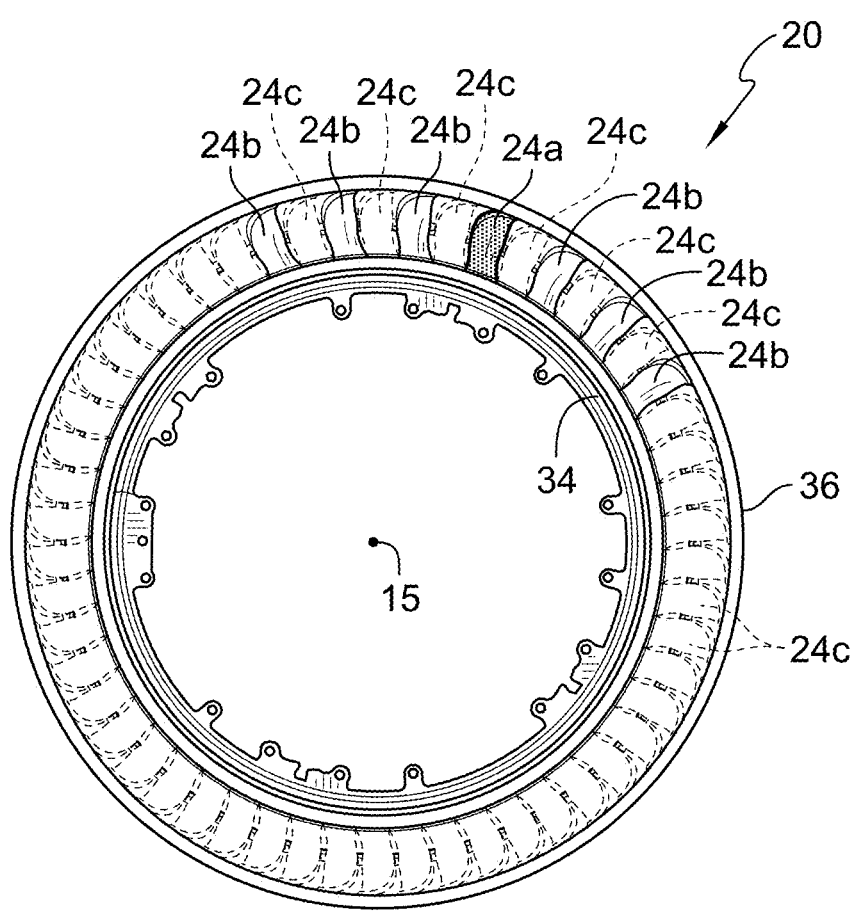

Referring now to FIG. 7, detuning and assessment of excitation response may be performed in a 1+stripe target phase. In the 1+stripe target phase, the target airfoil 24a and a number of nearby airfoils 24b remain without detuning, while other airfoils 24c are detuned. In the illustrative embodiment of the 1+stripe target phase, six airfoils 24b are not detuned in addition to the target airfoil 24a, however, the airfoils 24b are each separated from the next closest not detuned airfoil but a detuned airfoil 24c creating an alternating arrangement of detuned and not detuned airfoils—for example, airfoils $24c_i$, $24c_j$ immediately adjacent the target airfoil 24a on either circumferential side thereof are detuned, and the next closest airfoils $24b_i$, $24b_j$ are not detuned. The target airfoil 24a can then be subjected to focused excitation by the signal generator 40 for assessment to set a maximum excitation response in the 1+stripe target phase.

Figure 8:
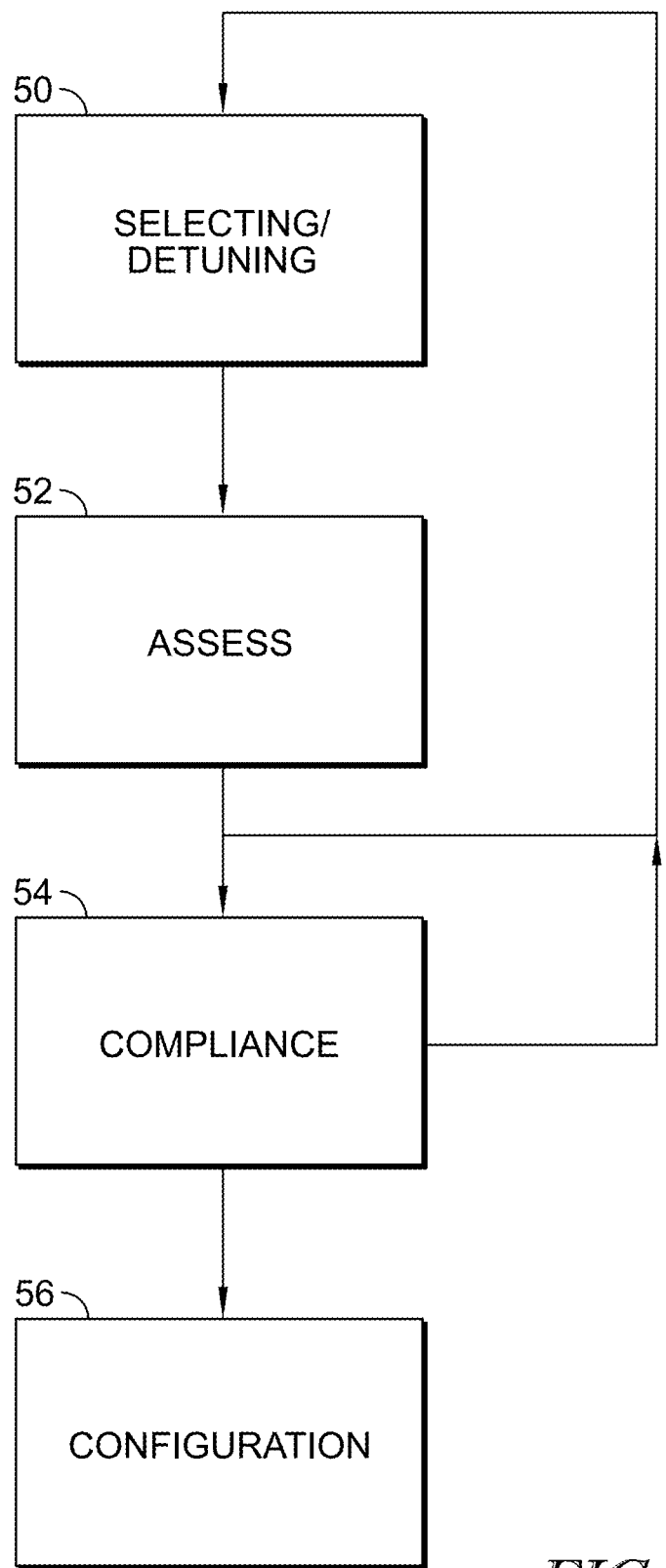
FIG. 8 is a diagrammatic view of a method of making an airfoil array such as the engine core stator.

Referring now to FIG. 8, making the engine core stator 20 is described according to boxes 50-58. Detuning is selectively applied and response assessed to allow determination of design compliance. Once design compliance is determined, the configuration of the airfoils 24 can be set.

In box 50, the one or more target airfoils 24 are selected for remaining without detuning. In instances where all airfoils 24 of the engine core stator 20 are equally formed, selection of target airfoils 24 may be performed according to the convenience of the available equipment, such as the geometries of the signal generator 40 and/or other constraints in consideration of the overall effects of the engine core stator.

Detuning is performed on the non-selected airfoils 24. Detuning illustratively includes securing additional mass to the non-selected airfoils 24. As discussed in additional detail herein, individualized mass can be secured with each individual non-selected airfoil 24. Although represented in a single box 50, selecting target airfoils and detuning non-selected airfoils can be considered distinctly from each other as with various phases of making, a principal target airfoil 24a is maintained as the focus point of operation.

In box 52, the excitation response of the engine core stator 20 is assessed. Assessment includes directing the signal generator to provide high energy waves to the one or more target airfoils. The principal target airfoil 24a can be the focus of the high energy waves, for example, by arranging the directional nozzle of the signal generator to concentrate energy on the principal target airfoil 24a. Assessment can include observing, measuring, and/or otherwise monitoring the response of the one or more target airfoils 24 from the signal generator 40.

Assessment includes arranging a vibration sensor to detect the vibratory amplitude of the target airfoils 24. In the illustrative embodiment, assessment includes arranging at least one vibration sensor to detect an amplitude of vibration response of the principal target airfoil 24a. The at least one vibration sensor is illustratively secured with the principal target airfoil 24a, however, in some embodiments, the at least one vibration sensor may include any suitable manner of vibration amplitude monitoring including direct and/or indirect vibration detection and/or video analysis.

During assessment, a maximum excitation response is set. The maximum excitation response includes the greatest response value during assessment. For example, in considering vibration amplitude as the response parameter, the greatest amplitude value assessed is set as the maximum response for the target phase. Optionally, a minimum threshold vibration response may be required. Achieving at least the minimum threshold vibration response proceeds to box 54, while failure to achieve a minimum threshold response, for example, a minimum threshold vibration amplitude of the principal target airfoil 24a, can return the operation to box 50. In some embodiments, the maximum excitation response may be set responsive to detection of deterioration of the target airfoil 24a and/or 24b, for example, by cracking and/or breaking.

In box 54, design compliance can be determined. The excitation response assessed in box 52 can be compared with the predicted operational response for gas turbine operation. The predicated operational response can include operational constraints including design margin. If the maximum excitation response remains with the predicted operational response, the airfoil configuration can be reliably set.

However, if the maximum excitation response exceeds the predicted operational response, it can be determined that the airfoil configuration may experience unacceptable response characteristics in actual use in the gas turbine engine, and reconfiguration may be required. By example, if the maximum vibration amplitude exceeds a predetermined predicated operational response amplitude allowable, the configuration may be deemed unacceptable. In some embodiments, deterioration of the target airfoil 24a, for example, by cracking and/or breaking which responsively sets a maximum excitation response which is below the predicted operational response, as a minimum operational parameter may be deemed unacceptable. Of course, comparison of the assessment information may be combined with physical inspection, for example, to consider whether wear and tear inflicted on the airfoils exceeds predicated operational response.

Determining design compliance for a target phase can optionally return to box 50 for consideration of different target phases, for example, as discussed above. Final design compliance of each relevant target phase can proceed to box 56.

In box 56, in response to determining design compliance for each relevant target phase, the existing airfoil configuration is set as the airfoil design configuration. In some embodiments, the process may return to box 50 for selection of other target airfoils 24 having different locations, as required according to the particularities of the design application. By setting airfoil design configuration, other parameters of gas turbine engine can be set, for example, spatial-geometric parameters for installation and/or structural support of the engine core stator.

In one exemplary form, the individual target phase may be selected in box 50, and detuning performed accordingly. Excitation response may be assessed in box 52, and determination of design compliance may be performed in box 54 according to the individual target phase. Following box 54 of the individual target phase, the process may return to box 50 to select the target airfoils, using the same principal target airfoil 24a, but to provide the 1+6 target phase as discussed above. Excitation response may be assessed in box 52, and determination of design compliance may be performed in box 54 according to the 1+6 target phase.

Following box 54 of the 1+6 target phase, the process may return to box 50 to select the target airfoils, using the same principal target airfoil 24a, but to provide the 1+16 target phase as discussed above. In the illustrative embodiment, the number of adjacent airfoils selected for remaining without detuning may be increased by one on either adjacent side through each iteration of assessment to determine the optimized arrangement, illustratively embodied in FIG. 5B for the present example. The optimized arrangement may be determined by observing a decrease in the maximum excitation response from the individual target phase. For example, responsive to observing a decrease in the maximum vibrational amplitude relative to the individual target phase, the present phase is deemed optimized, illustratively as that shown in FIG. 5B. In some embodiments, the excitation response may be driven until cracking of the target airfoil 24 to determine the onset response for deterioration.

Although explained above in exemplary terms, the conditions of the assessment may include multiple modes of assessment. For example, a first bending mode may be assessed, second bending mode may be assessed, and/or additional bending mode may be assessed. These distinct modes may each be compared to predicted operational response to determine design compliance. In some embodiments, other phase assessments may be performed. For example, completely without detuning and/or 1+stripe phase arrangements.

Figure 9:
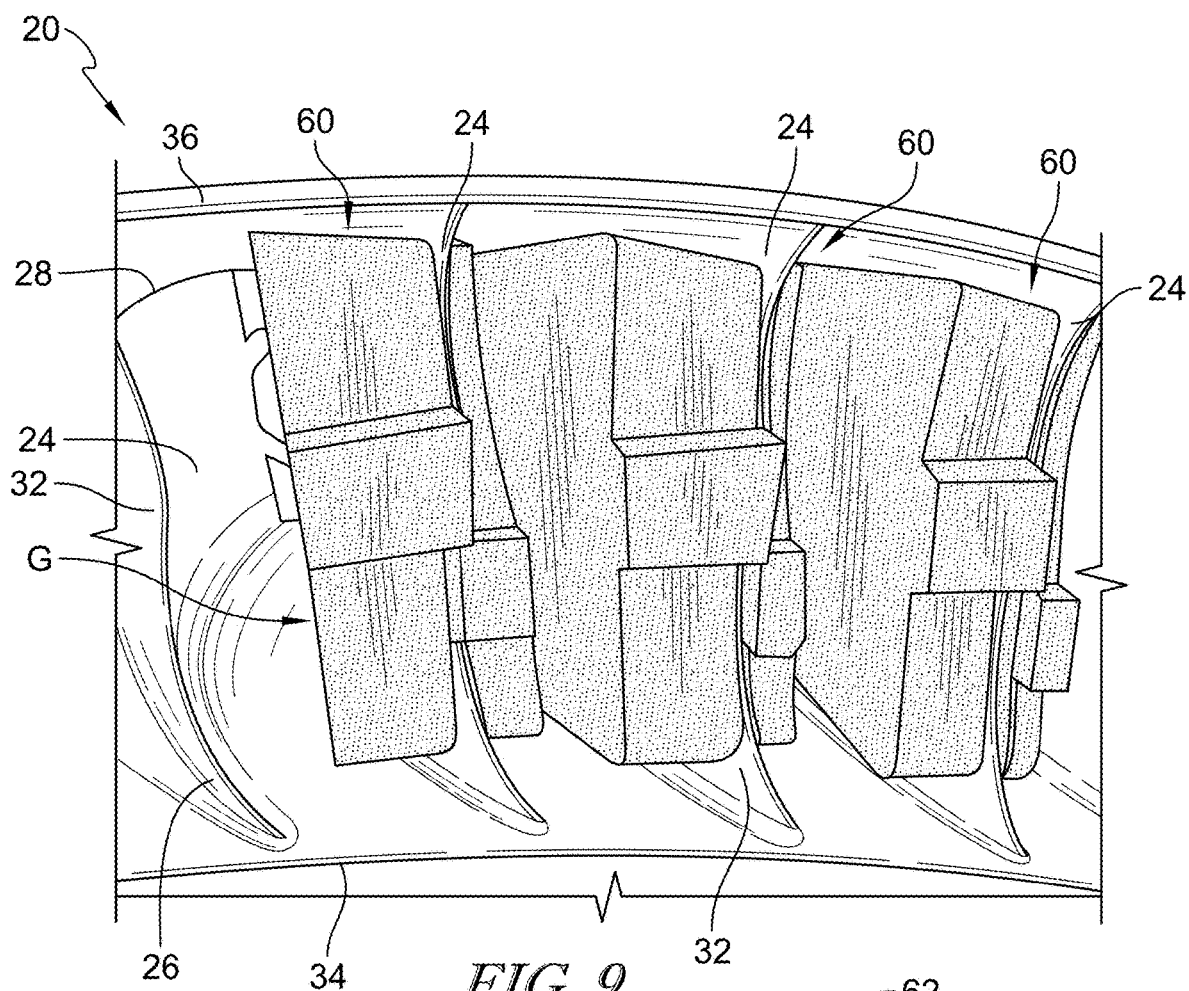
FIG. 9 is perspective view of a number of airfoils of the engine core stator being detuned by affixing detuning bodies thereto.
Figure 10:
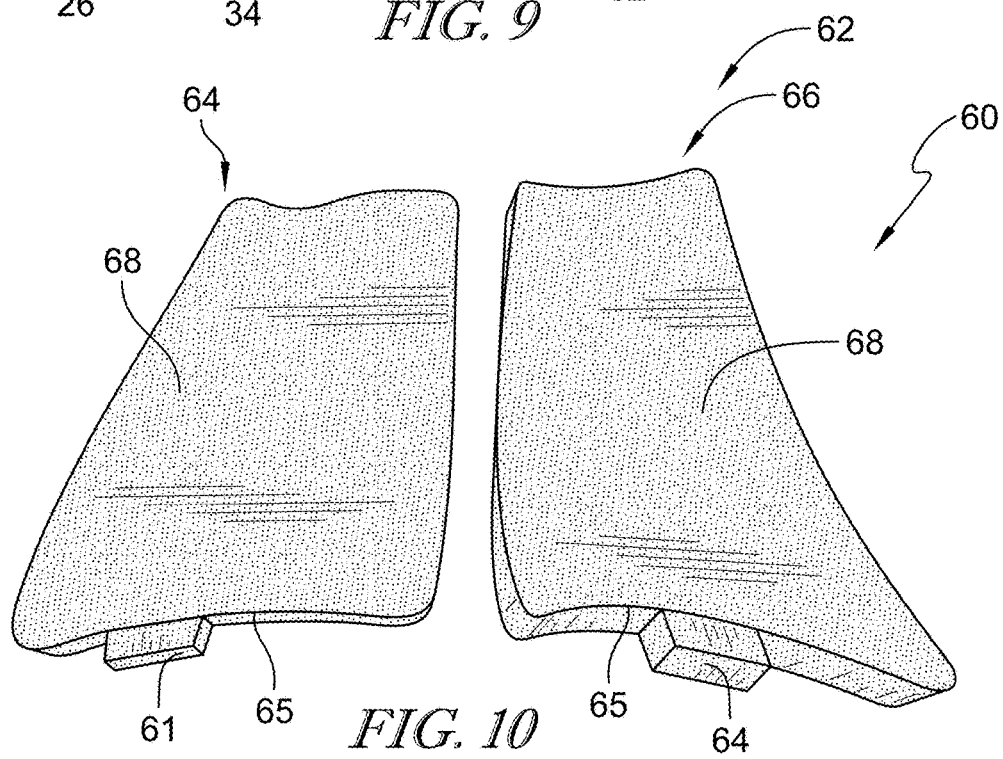
FIG. 10 is a perspective view of a detuning body laid open to show that conforming surfaces are formed on an inner side of portions of the detuning body for engagement with the airfoils.

Referring now to FIGS. 9 and 10, an illustrative detuning tool 60 is shown. Detuning tool 60 includes a detuning mass for conforming engagement with the airfoil 24 as shown in FIG. 9. The detuning mass of the detuning tool 60 provides significant mass to the airfoil 24 to disrupt the natural excitation response of the non-detuned airfoil 24.

In the illustrative embodiment as shown in FIG. 9, the detuning tool 60 includes detuning body 62 comprising a split frame including portions 64, 66 for securing about the subject airfoil 24 to disrupt the natural excitation response. Each portion 64,66 of the detuning body 62 defines an inner surface 68 that closely corresponds with the corresponding portion of the exterior airfoil surface 32. The inner surface 68 of each portion of the detuning body engages the corresponding portion of the exterior airfoil surface 32.

In the illustrative embodiment, the portion 64 is engaged with a portion of the exterior airfoil surface 32 on a pressure side (left side in the orientation of FIG. 9) of the subject airfoil 24, and the other portion 66 is engaged with a portion of the exterior airfoil surface 32 on a suction side (right side) of the subject airfoil 24. Accordingly, each portion 64,66 of the detuning tool is arranged within a different gap G between adjacent airfoils 24.

Notably, the detuning tool 60 covers nearly the entire surface area of the airfoil 24 to which it is secured, providing substantially complete contact with the exterior airfoil surface 32. By engaging the detuning body 62 with substantially all of the exterior airfoil surface 32 of each detuned airfoil 24, each detuned airfoil 24 can be reliably detuned. Conforming engagement of the detuning body 62 with the detuned airfoil can provide complete detuning.

As shown in FIG. 10, the inner surface 68 of are shown to have conforming shape with the corresponding portion of the exterior airfoil surface 32 of the of the subject airfoil 24. For instances in which each airfoil 24 of the airfoil array has the same shape of exterior airfoil surface 32, the detuning bodies 62 for each subject detuned airfoil may have portions 64, 66 having the same detuning characteristics including the same inner surfaces 68. In instances which airfoils 24 may be differently shaped from each other, the detuning bodies 62 can be formed to have specific detuning characteristics including inner surfaces 68 formed with specific correspondence to their corresponding airfoil 24. Yet, as providing such conforming detuning bodies can be challenging, the detuning bodies 62 can be made for appropriate use.

Each portion 64, 66 of the detuning body 62 includes an arm 61, 63 extending from the central portion for engagement with the other portion 64, 66 to secure the detuning body 62 with the corresponding airfoil 24. The arms 61, 63 each extend from a lower side 65 of the central portion of each portion 64, 66 the detuning body 62. The arms 61, 63 are each positioned in correspondence with each other for conforming engagement when secured with the corresponding airfoil 24.

Figure 11:
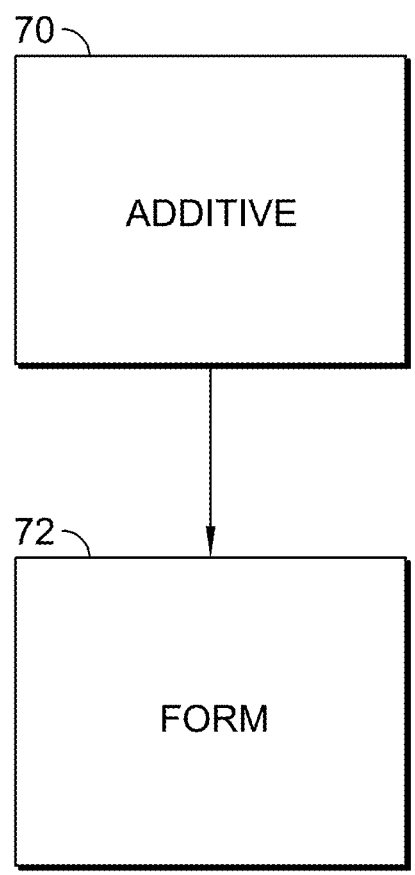
FIG. 11 is a diagrammatic view of a method of making the detuning body and/or the airfoil array of the engine core stator.

Referring now to FIG. 11, a manner of making a detuning body 62 is explained. In box 70, a mold for the detuning body 62 may be formed. Forming a mold can include forming a mock airfoil. The mock airfoil can be formed by additive manufacturing such as 3-dimensional (3D) printing to create the mock airfoil directly from design information such as 3D computer aided design tools. The mock airfoil can be applied to form a mold form having the shape of the exterior airfoil surface 32, and the mold form can be filled with mold material, for example, ceramics.

Once the mold is formed, in box 72, the detuning tool 60 can be formed by molding. The detuning tool 60 may include high mass materials, such as steel flakes suspended within thermoplastic. The molded detuning tool 60 can thus be quickly and easily formed to have highly consistent conformance with the exterior airfoil surface 32 of the corresponding airfoil 24. Accordingly, efficient formation of detuning bodies 62 and/or detuning can be achieved.

Within the present disclosure, development of methods and tooling for High Cycle Fatigue (HCF) test airfoils in a full 360° sector assembly can be achieved. Such tests may include testing of airfoil arrays having fixed-fixed boundary conditions, in a natural resonant mode higher than the fundamental. HCF testing can be required of many turbine engine components to ensure they can survive large dynamic/vibratory loads in the engine, for example, without cracking/breaking.

The present disclosure includes discussed of methods for HCF endurance strength assessment full sector fixed-fixed airfoil arrays. The present disclosure includes passive resonance detuning of airfoil arrays with full-field mass loading, and methods of tooling fabrication for passive resonance detuning of airfoils.

Full airfoil arrays (assemblies of airfoils), for example, those with fixed-fixed boundary conditions (notably, stator vanes), can present unique challenges for HCF testing. For example, in a lab environment, it can be difficult to provide enough energy into a fixed-fixed airfoil array to achieve sufficient stress amplitude to initiate a fatigue crack. This problem can be exacerbated with more complex mode shapes as they are more difficult to excite to damaging amplitudes. Although sectioning of the assemblies is possible, it poses validation challenges and should be avoided if possible.

As the amount of excitation energy and methods to provide such energy can be limited, one solution to such constraints can be to reduce wasted energy in the system, i.e. reduce losses through friction, acoustics, heat, and excitation of airfoils not targeted for HCF failure. Starting at the target airfoil, all other airfoils are detuned—this will over-constrain the system. Gradually, remove detuning masses (explained in following section) until excitation amplitude in the target airfoil is optimized, which can be apparent when removing an additional mass results in a decrease in excitation amplitude indicating that the system is optimized, as a balance between resonant harmony and/or minimizing wasted energy.

Passive resonance detuning of airfoil arrays with full-field mass loading can include detuning of airfoils to avoid resonant mode coupling and "cross-talk" between adjacent airfoils in an array. Historical methods can employ dummy planer masses and/or small round magnets. However, with increasingly complex 3D airfoil designs can experience local modes of excitation. It may not be feasible to detune each local mode. Additionally, while detuning the target resonant mode using current methods, higher order modes can be detuned to the target excitation frequency.

By recreating an airfoil shape (both sides) on clam-shell tooling with high mass density, the entire surface of the airfoil can be de-tuned simultaneously. Local modes and high order modes of concern can all be reduced to sub-critical frequencies. Some very high order modes may be reduced to the target excitation frequency, however, they typically exhibit inefficient energy transfer and are of less concern. This solution can also solve another problem of protecting non-target airfoils from fatigue damage.

With the present disclosure, fabrication of full-field detuning masses can be economical and/or have a low lead time. Ideally, all materials to fabricate can be sourced locally on-demand. The present disclosure includes methods of fabricating large quantities of high mass density tooling with integrated complex airfoil shapes.

Tooling can be created in CAD software and may be 3D printed. The tooling can have 2 halves (each with one side of the airfoil shape) and when assembled have two parallel planes that serve as surfaces for clamping. The tooling can be 3D printed. A silicon mold can be made of the printed shape. The mold can be filled with fine steel shot (low toxicity) in suspension in a low-temp thermoplastic, to reduce cure time and/or maintain suspension of the steel. Curing time can be dependent on bulk volume and temperature. For the RB3043 ESS detuning masses, the full cycle time (including potting, curing, demolding, and deflashing) was demonstrated on average to be ~15 min per mold in a ~32° F. cure environment. The final optional step is to add an elastomer coating to the contact surface to avoid damaging the airfoils. All materials can be locally sourced and are readily available making this solution affordable, fast, and/or logistically advantageous for the programs (e.g., 55 sets/110 individual pieces were produced for RB3043 in 2-3 days).

HCF testing of gas turbine engine airfoils in resonant modes other than the fundamental (i.e. other than an "easy-wise bend" mode shape) has historically been an industry-wide challenge. HCF testing of gas turbine engine airfoils with fixed-fixed boundary conditions (instead of typical fixed-free/cantilevered) can be particularly challenging.

Full-field airfoil mass detuning to eliminate local modal behavior may use rapid prototyping of masses to detune a large array of airfoils. In real-world conditions, detuning could be accomplished in 2-3 days as opposed to the estimated 2-6 months through traditional methods. The devices, systems, and/or methods of the present disclosure can provides inexpensive, short lead-time, reliable, and/or repeatable method to HCF test airfoils in higher order modes.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A method of making an airfoil array of a gas turbine engine by high cycle testing, the method comprising:
   selecting one or more target airfoils of the airfoil array having an existing configuration;
   detuning one or more detuned airfoils of the airfoil array other than the one or more target airfoils such that the selected one or more target airfoils are not detuned and the one or more detuned airfoils are detuned, wherein detuning includes securing detuning mass to the one or more detuned airfoils;
   assessing excitation response of the one or more target airfoils to set a maximum excitation response of the one or more target airfoils;
   determining design compliance by comparing the maximum excitation response to a predicted operational response of the airfoil array under operation of the gas turbine engine; and
   responsive to determining design compliance, setting airfoil design configuration for the airfoil array as the existing configuration of the one or more target airfoils.

2. A method of making an airfoil array of a gas turbine engine by high cycle testing, the method comprising:
   selecting one or more target airfoils of the airfoil array having an existing configuration;
   detuning one or more detuned airfoils of the airfoil array other than the one or more target airfoils, wherein detuning includes securing detuning mass to the one or more detuned airfoils;
   assessing excitation response of the one or more target airfoils to set a maximum excitation response of the one or more target airfoils;
   determining design compliance by comparing the maximum excitation response to a predicted operational response of the airfoil array under operation of the gas turbine engine;
   responsive to determining design compliance, setting airfoil design configuration for the airfoil array as the existing configuration of the one or more target airfoils; and
   after assessing excitation response of the one or more target airfoils to determine a maximum excitation response, removing detuning mass from one or more select ones of the detuned airfoils and re-assessing excitation response of the one or more target airfoils to set a revised maximum excitation.

3. The method of claim 2, further comprising, determining whether the revised maximum excitation represents decreased excitation amplitude of the one or more target airfoils from the maximum excitation response, and responsive to determination that the revised maximum excitation represents decreased excitation amplitude, setting the maximum excitation response as a design maximum of the one or more target airfoils.

4. The method of claim 1, wherein the maximum excitation response includes maximum excitation amplitude.

5. The method of claim 1, wherein securing detuning mass includes securing a detuning body to each of the one or more detuned airfoils.

6. The method of claim 5, wherein each detuning body includes an airfoil engagement surface conforming with an exterior airfoil-shaped surface of the corresponding detuned airfoil.

7. The method of claim 6, further comprising building each of the detuning bodies.

8. The method of claim 7, wherein building each of the detuning bodies includes forming at least one tooling member by additive manufacturing for forming a mold of one or more of the detuning bodies.

9. The method of claim 8, wherein the at least one tooling member includes a mock body of one or more of the detuning bodies.

10. The method of claim 5, wherein each detuning body comprises a split frame comprising high density material.

11. The method of claim 10, wherein each portion of the split frame of each detuning body is formed for engagement with a portion of an exterior airfoil-shaped surface of the corresponding detuned airfoil.

12. The method of claim 1, wherein detuning includes detuning all airfoils except for one target airfoil and eight airfoils immediately adjacent in the clockwise direction and eight airfoils immediately adjacent in the counter-clockwise direction relative to the target airfoil.

13. The method of claim 1, wherein detuning includes detuning all airfoils except for one target airfoil and five airfoils immediately adjacent in the clockwise direction and five airfoils immediately adjacent in the counter-clockwise direction relative to the target airfoil.

14. The method of claim 1, wherein detuning includes detuning all airfoils except for one target airfoil and three airfoils immediately adjacent in the clockwise direction and three airfoils immediately adjacent in the counter-clockwise direction relative to the target airfoil.

15. The method of claim 1, wherein detuning includes detuning all airfoils except for one target airfoil and second, fourth, and sixth airfoils adjacent in the clockwise direction and second, fourth, and sixth airfoils adjacent in the counter-clockwise direction relative to the target airfoil.

16. The method of claim 1, wherein detuning includes detuning all airfoils except for one target airfoil.

17. The method of claim 1, wherein the airfoil array is a fixed-boundary array comprising inner and outer end walls coupled with each airfoil of the airfoil array.

18. The method of claim 1, wherein the existing configuration includes an existing surface geometry of an exterior airfoil-shaped surface of the one or more target airfoils.

19. A method of making an airfoil array of a gas turbine engine by high cycle testing, the method comprising:
- selecting one or more target airfoils of the airfoil array having an existing configuration;
- detuning one or more detuned airfoils of the airfoil array other than the one or more target airfoils, wherein detuning includes securing detuning mass to the one or more detuned airfoils;
- assessing excitation response of the one or more target airfoils to set a maximum excitation response of the one or more target airfoils;
- determining design compliance by comparing the maximum excitation response to a predicted operational response of the airfoil array under operation of the gas turbine engine; and
- responsive to determining design compliance, setting airfoil design configuration for the airfoil array as the existing configuration of the one or more target airfoils,
- wherein assessing excitation response includes subjecting the airfoil array to output from a signal generator, and
- wherein the signal generator includes a sound wave generator.

* * * * *